United States Patent
Haneder et al.

(10) Patent No.: US 6,710,388 B2
(45) Date of Patent: Mar. 23, 2004

(54) FERROELECTRIC TRANSISTOR, USE THEREOF IN A MEMORY CELL CONFIGURATION AND METHOD OF PRODUCING THE FERROELECTRIC TRANSISTOR

(75) Inventors: Thomas Peter Haneder, München (DE); Hans Reisinger, Grünwald (DE); Reinhard Stengl, Stadtbergen (DE); Harald Bachhofer, München (DE); Hermann Wendt, Grasbrunn (DE); Wolfgang Hönlein, Unterhaching (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 09/801,209

(22) Filed: Mar. 7, 2001

(65) Prior Publication Data

US 2001/0038117 A1 Nov. 8, 2001

Related U.S. Application Data

(63) Continuation of application No. PCT/DE99/02083, filed on Jul. 5, 1999.

(30) Foreign Application Priority Data

Sep. 7, 1998 (DE) .......................... 198 40 824

(51) Int. Cl.$^7$ ............................................. H01L 27/108
(52) U.S. Cl. ................. 257/300; 257/245; 257/296; 257/310; 438/3
(58) Field of Search ................. 257/295–246, 257/342, 410, 411, 756, 300, 310

(56) References Cited

U.S. PATENT DOCUMENTS

| 5,365,094 A | * | 11/1994 | Takasu | 257/295 |
|---|---|---|---|---|
| 5,449,935 A | * | 9/1995 | Nakamura | 257/295 |
| 5,541,870 A | * | 7/1996 | Mihara et al. | 257/295 |
| 5,731,608 A | | 3/1998 | Hsu et al. | |
| 5,900,656 A | * | 5/1999 | Park | 257/295 |
| 5,932,904 A | * | 8/1999 | Hsu et al. | 257/295 |
| 5,973,379 A | * | 10/1999 | Ooms et al. | 257/295 |
| 5,989,927 A | * | 11/1999 | Yamanobe | 257/E29.272 |
| 6,011,285 A | * | 1/2000 | Hsu et al. | 257/295 |
| 6,074,885 A | * | 6/2000 | Boyer et al. | 257/E29.343 |
| 6,278,164 B1 | * | 8/2001 | Hieda et al. | 257/295 |
| 2002/0105016 A1 | * | 8/2002 | Haneder et al. | 257/295 |

FOREIGN PATENT DOCUMENTS

| EP | 0459773 A2 | 12/1991 | |
| EP | 0 540 993 A1 | * 5/1993 | ......... H01L/29/62 |
| EP | 0716455 A3 | 6/1996 | |
| EP | 0716455 A2 | 6/1996 | |

OTHER PUBLICATIONS

"A Single–Transistor Ferroelectric Memory Cell", Takahashi Nakamura et al., XP 000557557, IEEE, ISSCC, 1995, Technology Directions, Display, Photonics and Ferroelectric Memo, pp. 68–69 and 340.

* cited by examiner

*Primary Examiner*—Wael M. Fahmy
*Assistant Examiner*—Thao X. Le
(74) *Attorney, Agent, or Firm*—Laurence A. Greenberg; Werner H. Stemer; Ralph E. Locher

(57) ABSTRACT

A ferroelectric transistor suitable as a memory element has a first gate intermediate layer and a first gate electrode disposed on the surface of a semiconductor substrate and disposed between source/drain regions. The first gate intermediate layer contains at least one ferroelectric layer. In addition to the first gate intermediate layer, a second gate intermediate layer and a second gate electrode are configured between the source/drain regions. The second gate intermediate layer contains a dielectric layer. The first gate electrode and the second gate electrode are connected to each other via a diode structure.

16 Claims, 3 Drawing Sheets

FERROELECTRIC TRANSISTOR, USE THEREOF IN A MEMORY CELL CONFIGURATION AND METHOD OF PRODUCING THE FERROELECTRIC TRANSISTOR

CROSS-REFERENCE TO RELATED APPLICATION

This application is a continuation of copending International Application No. PCT/DE99/02083, filed Jul. 5, 1999, which designated the United States.

BACKGROUND OF THE INVENTION

FIELD OF THE INVENTION

The invention relates to a ferroelectric transistor that has two source/drain regions, a channel region, a gate electrode, and a layer of ferroelectric material provided between the gate electrode and the channel region. The conductivity of this transistor is dependent on the state of polarization of the layer of ferroelectric material. Ferroelectric transistors of this type are being investigated with regard to non-volatile memories. This involves assigning two different states of polarization of the layer of ferroelectric material to two different logical values of a digital item of information. Other possible applications for ferroelectric transistors of this type are, for example, in neural networks.

It is known (see for example T. Nakamura, Y. Nakao, A. Kamisawa, H. Takasu: A Single Transistor Ferroelectric Memory Cell, IEEE, ISSCC, 1995, pages 68 to 69), to use ferroelectric transistors as memory cells of a memory cell configuration. In this case, each of the ferroelectric transistors is connected between a supply voltage line and a bit line. The selection takes place via a back gate. The ferroelectric transistors used have a floating gate electrode between the ferroelectric layer and the gate oxide. The charge of the floating gate electrode is controlled via the state of polarization of the ferroelectric layer.

It has been found that, when reading the information, voltage drops occur even at non-selected memory cells and this may lead to a falsification of the information stored in the individual memory cells. This falsification is attributed to the fact that flipping processes of the domains in ferroelectric materials are of a random nature and can be induced even at low voltages.

SUMMARY OF THE INVENTION

It is accordingly an object of the invention to provide a ferroelectric transistor and a method of producing the transistor which overcomes the above-mentioned disadvantageous of the prior art apparatus and methods of this general type. In particular, it is an object of the invention to provide a ferroelectric transistor which is suitable as a memory cell of a memory cell configuration and in which changing of the written information during the reading operation is avoided.

With the foregoing and other objects in view there is provided, in accordance with the invention a ferroelectric transistor that has two source/drain regions, which are configured in a semiconductor substrate. All semiconductor materials, in particular monocrystalline silicon, are suitable as the semiconductor substrate. The semiconductor substrate may in this case be both a monocrystalline silicon wafer and a SOI substrate. Configured on the surface of the semiconductor substrate between the two source/drain regions is a first gate intermediate layer and a first gate electrode. The first gate intermediate layer contains at least one ferroelectric layer. Configured between the source/drain regions, in the direction of a joining line between the source/drain regions, there is in addition to the first gate intermediate layer, a second gate intermediate layer and a second gate electrode. The second gate intermediate layer contains a dielectric layer. The first gate electrode and the second gate electrode are connected to each other via a diode structure.

In this ferroelectric transistor, the first gate electrode and the second gate electrode are configured next to each other along the joining line between the source/drain regions. The channel region of the ferroelectric transistor is consequently subdivided. One part of the channel region, which is configured under the first gate electrode, is capable of being activated by the charge effective at the first gate electrode. Another part of the channel region, which is configured under the second gate electrode, is capable of being activated by the charge effective at the second gate electrode. Current can flow between the source/drain regions only when both the part of the channel region below the first gate electrode and the part of the channel region below the second gate electrode are conducting.

The diode structure is polarized in such a way that, when a voltage is present at the second gate electrode, the conductivity of the channel region under the second gate electrode is controlled, the diode structure blocks, and as a result, the first gate electrode is isolated from this voltage.

When the ferroelectric transistor is being used as a memory for digital information, two states of polarization are assigned to the logical values in the ferroelectric layer. In the case of one state of polarization, the channel region below the first gate electrode and the ferroelectric layer is conducting, in the case of the other state it is not.

Since the first gate electrode and the second gate electrode are configured next to each other in the direction of the joining line between the source/drain regions, the activation by the second gate electrode is adequate for performing the reading operation. Dependent on the state of polarization of the ferroelectric layer, the channel region below the first gate electrode is or is not conducting. By activating the second gate electrode in such a way that the transistor in the region of the second gate electrode is turned on, the information is read out, and it is assessed whether a current is or is not flowing via the transistor.

The diode structure which is configured between the first gate electrode and the second gate electrode ensures that the voltage for activating the second gate electrode drops only over the second gate electrode. The first gate electrode is isolated from this voltage via the diode structure, so that no voltage drops over the ferroelectric layer. As a result, changing of the polarization of the ferroelectric layer, and consequently of the stored information, is avoided.

Alternatively, a voltage may be applied to the second gate electrode in order to polarize the ferroelectric layer. This is used for writing and erasing information.

Writing of information takes place in this case by a voltage which is greater than the reverse voltage of the diode structure and which polarizes the ferroelectric layer in one direction.

Erasing of the information takes place by a voltage with a different algebraic sign, so that the diode structure is polarized in the conducting direction and the voltage dropping across the ferroelectric layer polarizes the latter in the other direction.

The terms writing and erasing of information can also be used vice versa in this connection.

In accordance with an added feature of the invention, the second gate intermediate layer and the second gate electrode are respectively made up of two substructures which are configured mirror-symmetrically in relation to the first gate intermediate layer. The two substructures of the second gate electrode are electrically connected to each other. This configuration has the advantage that the voltage present across the second gate electrode induces, during the reading operation, an electric field of such a kind that the ferroelectric layer lies on an equipotential line and consequently no change in the polarization of the ferroelectric layer occurs. This configuration of the invention is particularly insensitive to disturbances.

In accordance with an additional feature of the invention, a dielectric layer is provided between the surface of the semiconductor substrate and the ferroelectric layer. This facilitates the application of the ferroelectric layer.

In accordance with another feature of the invention, the dielectric layer which is configured in the first gate intermediate layer between the semiconductor surface and the ferroelectric layer, and the dielectric layer which is a component part of the second gate intermediate layer are formed as a continuous electrical layer. The stack including the ferroelectric layer and the first gate electrode is produced on the surface of the continuous electrical layer.

In accordance with a further feature of the invention, the first gate electrode and/or the second gate electrode are part of the diode structure. In this way, the space requirement of the diode structure is reduced.

In accordance with a further added feature of the invention, the first gate electrode has polycrystalline silicon which is doped of a first conductivity type. The second gate electrode likewise has polycrystalline silicon which is doped of a second conductivity type, opposite that of the first type. The first gate electrode is in this case adjacent to the second gate electrode, so that the diode structure is formed by the first gate electrode and the second gate electrode. In this configuration, only three terminals are required for the operation of the ferroelectric transistor, two at the source/drain regions and one at the second gate electrode. Alternatively, in this configuration the first gate electrode and the second gate electrode can be respectively formed by correspondingly doped epitaxially grown silicon.

In accordance with a further additional feature of the invention, an auxiliary layer, for example of platinum, is provided between the ferroelectric layer and the first gate electrode. The auxiliary layer avoids undesired properties of the ferroelectric layer, such as for example, fatigue or imprint resistance.

In accordance with yet another feature of the invention, the first gate intermediate layer contains a dielectric layer of $CeO_2$, $ZrO_2$, $Y_2O_3$, or another oxide with the greatest possible dielectric susceptibility, for example $SrTiO_3$. For the dielectric layer in the second gate intermediate layer, $SiO_2$, $CeO_2$, $ZrO_2$, $Y_2O_3$, or another oxide with the greatest possible dielectric susceptibility, for example $SrTiO_3$, is suitable. The ferroelectric layer may be composed of, inter alia, strontium-bismuth-tantalum (SBT), lead-zirconium-titanate (PZT), lithium niobate ($LiNbO_3$) or barium-strontium-titanate (BST).

With the foregoing and other objects in view there is also provided, in accordance with the invention, a memory cell configuration including a plurality of memory cells that include the above described ferroelectric transistor.

With regard to the interference immunity of the memory cell configuration during the reading, writing and erasing of information, it is advantageous, in this case, to provide each memory cell with, in addition to the ferroelectric transistor, a selection transistor having a control electrode. In addition, the memory cell configuration has word lines, bit lines and supply lines, the word lines cross the supply lines and the bit lines. The ferroelectric transistor of one of the memory cells is, in each case, connected between two neighboring bit lines. The selection transistor is connected between the second gate electrode and one of the supply voltage lines. The control electrode of the selection transistor is respectively connected to one of the word lines.

With the foregoing and other objects in view there is also provided, in accordance with the invention, a method of producing a ferroelectric transistor, which includes: providing a semiconductor substrate with a surface; applying, to the surface of the semiconductor substrate, a dielectric layer, a ferroelectric layer, and a first electrode layer; structuring the first electrode layer and the ferroelectric layer together to produce a first gate electrod; applying and structuring a second electrode layer to produce a second gate electrode adjacent and laterally overlapping the first gate electrode; and providing the first gate electrode and the second gate electrode from materials that are matched to each other in such a way that the first gate electrode and the second gate electrode form a diode structure.

With the foregoing and other objects in view there is also provided, in accordance with the invention, a method of producing a ferroelectric transistor, which includes: providing a semiconductor substrate with a surface; applying, to the surface of the semiconductor substrate, a first gate intermediate layer, a ferroelectric layer, and a first electrode layer; structuring the first electrode layer the ferroelectric layer, and the first electrode layer together to produce a first gate electrode; producing a second gate intermediate layer disposed laterally relative to the first gate intermediate layer; providing the second gate intermediate layer with a dielectric layer; applying and structuring a second electrode layer to produce a second gate electrode adjacent and laterally overlapping the first gate electrode; and providing the first gate electrode and the second gate electrode from materials that are matched to each other in such a way that the first gate electrode and the second gate electrode form a diode structure.

In accordance with a concomitant feature of the invention, the method includes steps of, applying an auxiliary layer between the ferroelectric layer and the first electrode layer; and structuring the auxiliary layer when performing the step of structuring the ferroelectric layer and the first electrode layer.

Other features which are considered as characteristic for the invention are set forth in the appended claims.

Although the invention is illustrated and described herein as embodied in a ferroelectric transistor, use thereof in a memory cell configuration and method of producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
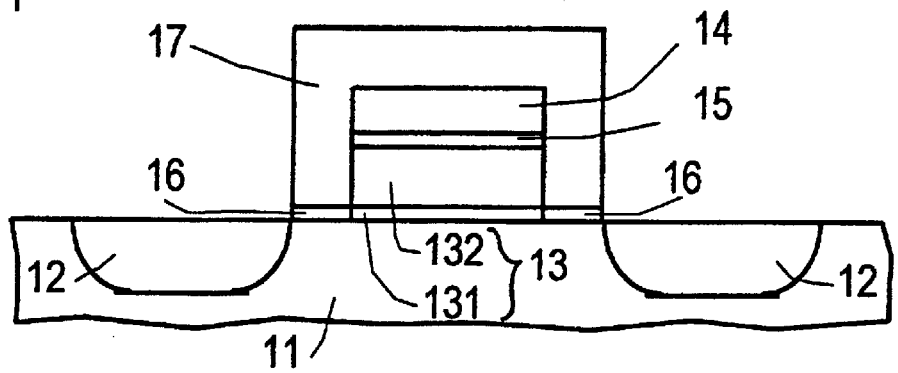
FIG. 1 shows a section through a ferroelectric transistor.

Referring now to the figures of the drawing in detail and first, particularly, to FIG. 1 thereof, there is shown a cross-sectional view taken through a ferroelectric transistor. Two source/drain regions 12 are configured in a p-doped semiconductor substrate 11 made of monocrystalline silicon. A first gate intermediate layer 13 and a first gate electrode 14 are configured between the source/drain regions 12 on the surface of the semiconductor substrate 11. The first gate intermediate layer 13 has a dimension, in the direction of the line joining the two source/drain regions 12, that is smaller than the distance between the two source/drain regions 12. The first gate intermediate layer 13 has a first dielectric layer 131 and a ferroelectric layer 132. The first dielectric layer 131 contains $CeO_2$ and has a thickness of 5 to 10 nm. The ferroelectric layer 132 has a thickness of 50 to 100 nm and contains strontium-bismuth-tantalum (SBT) or lead-zirconium-titanate (PZT). The first gate electrode 14 has a thickness of 30 to 50 nm and is formed from $p^+$-doped polysilicon with a dopant concentration in the order of $10^{19}$ $cm^{-3}$. An auxiliary layer 15 is configured between the first gate electrode 14 and the ferroelectric layer 132. The auxiliary layer 15 protects the ferroelectric layer 132 and is formed from platinum in a thickness of 30 nm.

A second dielectric layer 16 of $SiO_2$ having a layer thickness of 5 to 10 nm is configured laterally in relation to the first dielectric layer 131. The second dielectric layer 16 includes two parts. One part is configured between one of the source/drain regions 12 and the first dielectric layer 131 and the other part is configured between the other source/drain region 12 and the first dielectric layer 131. The two parts of the second dielectric layer 16 are configured mirror-symmetrically in relation to the first dielectric layer 131. The two parts of the second dielectric layer 16 act as a second gate intermediate layer. A second gate electrode 17 of $n^+$-doped polysilicon is configured above the second dielectric layer 16. The second gate electrode 17 covers the first gate electrode 14, so that it has a U-shaped cross section in the section shown in FIG. 1. As a result, the two parts of the second gate electrode 17, which are configured on the surface of the two parts of the second dielectric layer 16, are electrically connected to each other. Furthermore, the second gate electrode 17 is adjacent to the surface of the first gate electrode 14. The first gate electrode 14 and the second gate electrode 17 together form a diode structure.

For writing information into the ferroelectric transistor, the pn junction, which is formed by the first gate electrode 14 and the second gate electrode 17, is operated in the conducting direction, that is to say, a negative voltage pulse is applied to the $n^+$-doped second gate electrode 17. As a result, the ferroelectric layer 132 is polarized in such a way that the part of the channel region configured under the first gate intermediate layer 13 is in accumulation and therefore blocks.

For reading from the memory transistor, on the other hand, the pn junction, which is formed by the first electrode 14 and the second gate electrode 17, is operated in the non-conducting direction below the breakdown voltage. As a result, the channel region is brought into inversion via the second gate electrode 17 on both sides of the ferroelectric layer 132, without the state of polarization of the ferroelectric layer 132 changing in the process. A current flows via the transistor only when the ferroelectric layer 132 is polarized in such a way that the part of the channel region which is below the first gate intermediate layer 13, that is to say below the ferroelectric layer 132, is also in inversion. Otherwise, no current flows via the transistor. The states "current flow via the transistor" and "no current flow via the transistor" are consequently assigned to the various items of logical information.

To erase the information stored in the ferroelectric layer 132, the pn junction formed by the first gate electrode 14 and the second gate electrode 17 is operated in the non-conducting direction above its breakdown voltage. As a result, the ferroelectric layer 132 is polarized in such a way that the channel region below the first gate intermediate layer 13 is in inversion and therefore conducts.

Figure 2:
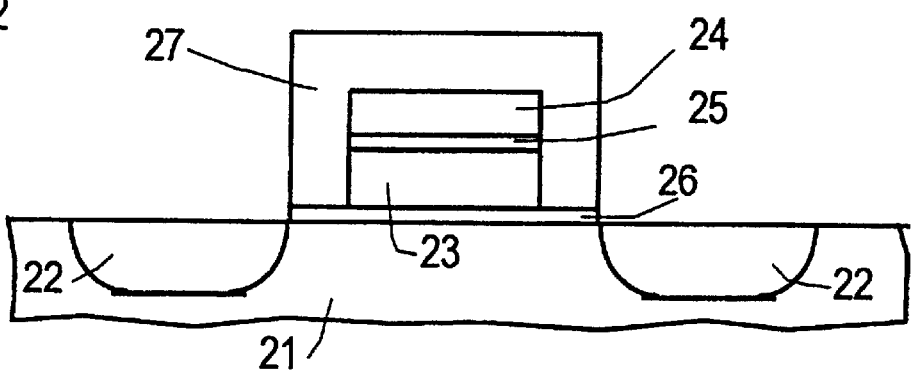
FIG. 2 shows a section through a ferroelectric transistor in which the first gate intermediate layer and the second gate intermediate layer have a continuous dielectric layer.

Referring to FIG. 2, there is shown a cross-sectional view taken through a further exemplary embodiment of the ferroelectric transistor. The further exemplary embodiment includes a semiconductor substrate 21 that has two source/drain regions 22 designed in a form analogous to that explained with reference to the embodiment shown in FIG. 1. A dielectric layer 26 having a layer thickness of 5 to 10 nm and formed from $CeO_2$ or $ZrO_2$ is configured between the source/drain regions 22 on the surface of the semiconductor substrate 21. A ferroelectric layer 23 is configured on the surface of the dielectric layer 26. The dimension of the ferroelectric layer 23 parallel to the surface of the substrate 21 is smaller than that of the dielectric layer 26. The dielectric layer 26 protrudes laterally beyond the ferroelectric layer 23. An auxiliary layer 25 is configured on the surface of the ferroelectric layer 23. A first gate electrode 24 is configured on the surface of the auxiliary layer 25. A second gate electrode 27 abuts the surface of the dielectric layer 26 on both sides of the ferroelectric layer 23 and covers the first gate electrode 24. The ferroelectric layer 23, the auxiliary layer 25, the first gate electrode 24, and the second gate electrode 27 are configured in a way analogous to that explained with reference to the embodiment shown in FIG. 1. The operating mode of the ferroelectric transistor represented in FIG. 2 takes place in a way analogous to that explained on the basis of FIG. 1.

Figure 3:
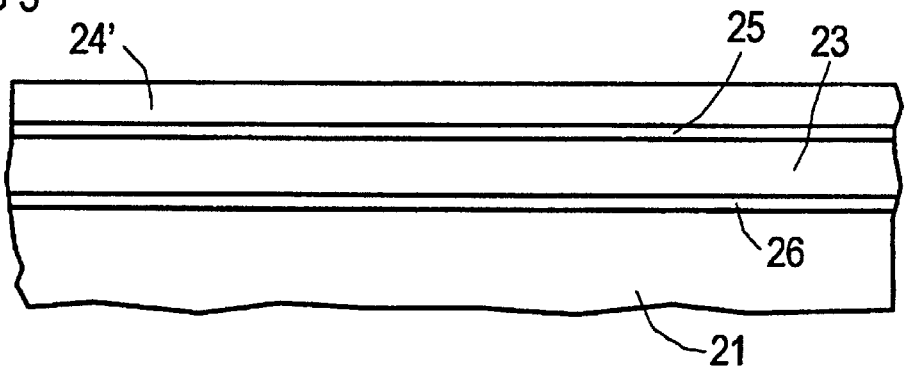
FIGS. 3 to 5 show steps used to produce the ferroelectric transistor which is shown in FIG. 2.

To produce the ferroelectric transistor represented in FIG. 2, the dielectric layer 26 is deposited onto the surface of the semiconductor substrate 21, in which first active and non-active regions were defined by an isolating technique, and in which trenches were implanted in a known way (not represented). An appropriate isolating technique can be, for example, a LOCOS technique or an STI (Shallow Trench Isolation) technique (not represented). The ferroelectric layer 23 is applied to the dielectric layer 26 by a single-stage or multi-stage sol-gel process or by a CVD process. A heat treatment at 700° C. follows, in order to bring the ferroelectric layer 23 into the desired ferroelectric phase. The auxiliary layer 25 of platinum is then applied to the surface of the ferroelectric layer 23 by sputtering. A p-doped polysilicon layer 24' is deposited onto the auxiliary layer 25 (see FIG. 3).

Subsequently, using a photoresist mask which defines the form of the first gate electrode 24, the $p^+$-doped polysilicon layer 24', the auxiliary layer 25 and the ferroelectric layer 23 are structured down to the surface of the dielectric layer 26. Used for this purpose is a multi-stage etching process in which HBr or HCl is used for structuring the p+-doped polysilicon layer 24' and $Cl_2$ and/or Ar with additions of heavy gases, such as for example $SF_6$, $BCl_3$, is used for structuring the auxiliary layer 25 of the ferroelectric layer 26.

Figure 4:
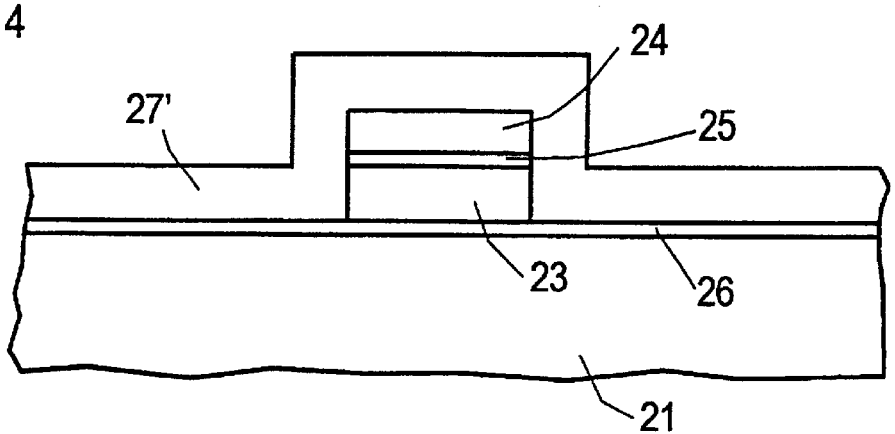
Figure 5:
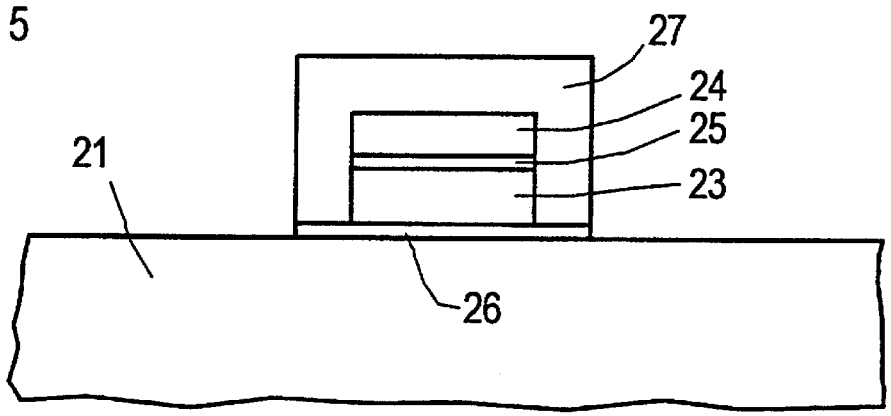

Subsequently, a n-doped polysilicon layer 27' is deposited, having a thickness of 120 to 150 nm (See FIG. 4). In a following, multi-stage etching process, the n-doped polysilicon layer 27' and the dielectric layer 26 are structured, with the second gate electrode 27 being formed. The second gate electrode 27 overlaps the first gate electrode 24 laterally on both sides. HBr or HCl is used for structuring the n-doped polysilicon layer 27'. Cl, Ar, or a mixture of Cl and Ar with additions of heavy gases, such as for example $SF_6$, $BCl_3$, is used for structuring the dielectric layer 26 (see FIG. 5).

By implantation with arsenic, the source/drain regions 22 are then implanted in a self-adjusted manner in relation to the second gate electrode 24. This completes the ferroelectric transistor represented in FIG. 2.

The production process can be varied in many different ways. In particular, the heat treatment for fixing the desired ferroelectric phase of the ferroelectric layer 23 may also take place after the deposition of the p-doped polysilicon layer 24, if the required temperature is low enough so that no $SiO_2$ forms above the auxiliary layer 25 and below the first electrode. Preferably, the heat treatment is performed after deposition of the auxiliary layer 25. Furthermore, in the structuring of the first gate electrode 24, the dielectric layer 26 may be structured at the same time down to the surface of the semiconductor substrate 21 and the heat treatment may take place after forming the first gate electrode 24. In this case, during this heat treatment, an $SiO_2$ layer is formed on the surface of the semiconductor substrate 21, lateral to the first gate electrode 24 and is used thereafter as a gate oxide below the second gate electrode 27 lateral to the first gate electrode 24. The heat treatment is in this case preferably controlled in such a way that an $SiO_2$ layer is not at the same time produced between the first gate electrode 24 and the auxiliary layer 25.

Furthermore, the source/drain regions 22 may also be produced with an LDD profile. For this purpose, spacers are formed on the edges of the second gate electrode 27 in the course of the process.

In the exemplary embodiments, the construction of an n-channel transistor has been described. The invention can be carried out in an analogous way for a p-channel transistor; in this case, all of the conductivity types are to be changed over correspondingly.

Figure 6:
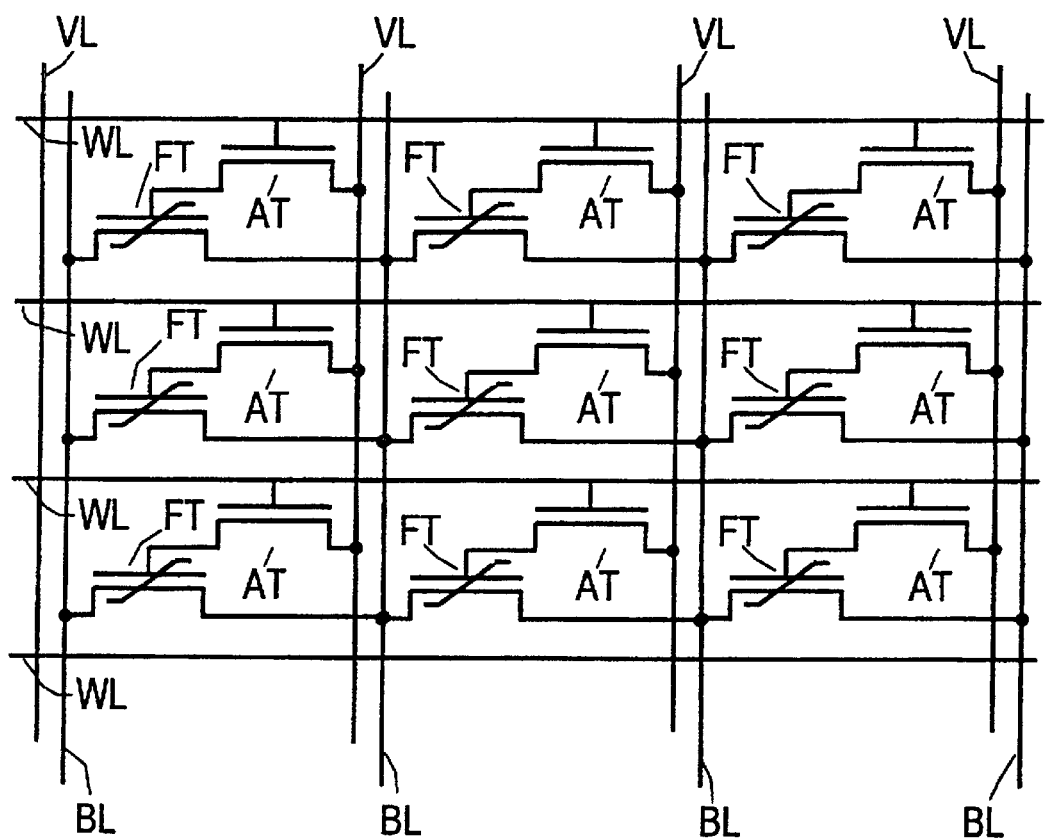
FIG. 6 shows a circuit diagram for a memory cell configuration.

In a memory cell configuration, a large number of memory cells are provided, each of which has a ferroelectric transistor FT and a selection transistor AT (see FIG. 6). The ferroelectric transistor FT is in each case configured in the way explained on the basis of FIG. 1 or FIG. 2. The selection transistor AT is configured as a MOS transistor with a gate electrode. The memory cell configuration additionally includes word lines WL, supply lines VL and bit lines BL. The word lines WL cross both the supply lines VL and the bit lines BL.

The ferroelectric transistor FT of each of the memory cells is respectively connected between two neighboring bit lines BL. The selection transistor AT of the corresponding memory cell is connected between the second gate electrode of the ferroelectric transistor FT and a supply line VL. The gate electrode of the selection transistor AT is connected to one of the word lines WL.

The selection of a memory cell takes place in the memory cell configuration via the corresponding word line WL and the corresponding supply line VL.

Reading from the memory cell takes place by performing a continuity test between the neighboring bit lines BL, between which the corresponding ferroelectric transistor FT is connected. To read out the information, the associated supply line VL is subjected to a voltage level, so that the pn junction formed by the first gate electrode and second gate electrode in the ferroelectric transistor is operated in the non-conducting direction below the breakdown voltage. The second gate electrode in this case brings the channel region of the ferroelectric transistor laterally in relation to the ferroelectric layer locally into inversion, without at the same time changing the state of polarization of the ferroelectric layer. A current flows through the ferroelectric transistor only when the ferroelectric layer is polarized in such a way that the channel region below the ferroelectric layer is also in inversion. A current can only flow between the neighboring bit lines BL if the selected ferroelectric transistor FT is turned on, that is to say if the ferroelectric layer is correspondingly polarized.

To write information into the ferroelectric transistor FT of a memory cell, the selection likewise takes place via the corresponding word line WL and the corresponding supply line VL. In this case, the corresponding supply line VL is subjected to a level by which the pn junction which is formed by the first gate electrode and second gate electrode of the ferroelectric transistor FT is operated in the conducting direction. As a result, the ferroelectric layer is polarized in such a way that the channel region below the ferroelectric layer is in accumulation and therefore blocks.

To erase information in the ferroelectric transistor of a memory cell, the memory cell is likewise selected via the word line WL and the supply line VL. A voltage level of such a kind that the pn junction formed by the first gate electrode and second gate electrode of the ferroelectric transistor is operated in the non-conducting direction above its breakdown voltage is applied to the supply line VL. As a result, the ferroelectric layer is polarized in such a way that the channel region below the ferroelectric layer is in inversion and therefore conducts.

During the reading operation, writing operation and erasing operation, all of the other memory cells which are connected to the same bit lines BL or supply lines VL are connected to other word lines WL. They are therefore not selected and block.

The various operating states of writing, reading and erasing are set by means of different voltage levels at the supply line. For operating the memory cell configuration with a ferroelectric transistor with a ferroelectric material having a coercive field strength $E_c$ of approximately 30 kV/cm and a dielectric layer 131 having a relative dielectric constant $\epsilon_r$ of approximately 20 which is constructed in a way analogous to that explained on the basis of FIG. 1 or 2, the following levels are suitable:

Reading: +0.5 V;

Writing: +3 V; and

Erasing: −3 V.

We claim:

1. A ferroelectric transistor, comprising:

a semiconductor substrate having a surface and having two source/drain regions therein;

a first gate intermediate layer and a first gate electrode configured on said surface of said semiconductor substrate between said source/drain regions, said first gate intermediate layer including at least one ferroelectric layer;

a second gate intermediate layer and a second gate electrode configured between said source/drain regions and extending in a direction of a line running between said source/drain regions, said first gate intermediate layer also extending in the direction of the line running between said source/drain regions, said second gate intermediate layer including a dielectric layer; and a diode structure connecting said first gate electrode to said second gate electrode.

2. The ferroelectric transistor according to claim 1, wherein:

said second gate intermediate layer includes two substructures configured mirror-symmetrically in relation to said first gate intermediate layer;

said second gate electrode includes two substructures configured mirror-symmetrically in relation to said first gate intermediate layer; and said two substructures of said second gate electrode are electrically connected to each other.

3. The ferroelectric transistor according to claim 2, wherein said first gate intermediate layer includes a dielectric layer configured between said surface of said semiconductor substrate and said ferroelectric layer.

4. The ferroelectric transistor according to claim 1, wherein said first gate intermediate layer includes a dielectric layer configured between said surface of said semiconductor substrate and said ferroelectric layer.

5. The ferroelectric transistor according to claim 4, wherein said dielectric layer of said first gate intermediate layer and said dielectric layer of said second gate intermediate layer are formed as a continuous dielectric layer.

6. The ferroelectric transistor according to claim 1, comprising a diode structure connecting said first gate electrode to said second gate electrode, said diode structure including an electrode selected from the group consisting of said first gate electrode and said second gate electrode.

7. The ferroelectric transistor according to claim 5, wherein;

said first gate electrode includes polycrystalline silicon including doping of a first conductivity type;

said second gate electrode includes polycrystalline silicon including doping of a second conductivity type that is opposite said first conductivity type; and said first gate electrode adjacent said second gate electrode.

8. The ferroelectric transistor according to claim 1, comprising an auxiliary layer disposed between said ferroelectric layer and said first gate electrode.

9. The ferroelectric transistor according to claim 1, wherein:

said first gate intermediate layer includes a material selected from the group consisting of $CeO_2$, $ZrO_2$, $Y2O_3$, and $SrTiO_3$;

said second gate intermediate layer includes a material selected from the group consisting of $SiO_2$, $CeO_2$, $ZrO_2$, and $SrTiO_3$;

said ferroelectric layer includes a material selected from the group consisting of strontium-bismuth-tantalum, lead-zirconium-titante, lithium-niobate and barium-strontium-titanate; and said semiconductor substrate includes monocrystalline silicon.

10. The ferroelectric transistor according to claim 1, wherein said first gate electrode and said second gate electrode form a diode structure.

11. A memory cell configuration including a plurality of memory cells, each one of said plurality of said memory cells including a ferroelectric transistor, comprising:

a semiconductor substrate having a surface and having two source/drain regions therein;

a first gate intermediate layer and a first gate electrode configured on said surface of said semiconductor substrate between said source/drain regions, said first gate intermediate layer including at least one ferroelectric layer;

a second gate intermediate layer and a second gate electrode configured between said source/drain regions and extending in a direction of a line running between said source/drain regions, said first gate intermediate layer also extending in the direction of the line running between said source/drain regions, said second gate intermediate layer including a dielectric layer; and a diode structure connecting said first gate electrode to said second gate electrode.

12. The memory cell configuration according to claim 11, comprising:

a plurality of bit lines, a plurality of supply lines, and a plurality of word lines crossing said plurality of said supply lines and said plurality of said bit lines;

each one of said plurality of said memory cells including a selection transistor connected between said second gate electrode of said ferroelectric transistor of the one of said plurality of said memory cells and one of said plurality of said supply lines, said selection transistor of each one of said memory cells including a control electrode connected to one of said plurality of said word lines; and said ferroelectric transistor of each one of said plurality of said memory cells connected between adjacent ones of said plurality of said bit lines.

13. A method of producing a ferroelectric transistor according to claim 1, which comprises:

providing a semiconductor substrate with a surface;

applying, to the surface of the semiconductor substrate, a dielectric layer and a ferroelectric layer to provide a first intermediate layer, and a first electrode layer;

structuring the first electrode layer and the ferroelectric layer together to produce a first gate electrode, thereby leaving the dielectric layer to provide a second intermediate layer;

applying and structuring a second electrode layer to produce a second gate electrode adjacent and laterally overlapping the first gate electrode; and providing the first gate electrode and the second gate electrode from materials that are matched to each other in such a way that the first gate electrode and the second gate electrode form a diode structure.

14. The method according to claim 13, which comprises:

applying an auxiliary layer between the ferroelectric layer and the first electrode layer; and structuring the auxiliary layer when performing the step of structuring the ferroelectric layer and the first electrode layer.

15. A method of producing a ferroelectric transistor according to claim 1, which comprises:
   providing a semiconductor substrate with a surface;
   applying, to the surface of the semiconductor substrate, a first gate intermediate layer, a ferroelectric layer, and a first electrode layer;
   structuring the first electrode layer the ferroelectric layer, and the first electrode layer together to produce a first gate electrode;
   producing a second gate intermediate layer disposed laterally relative to the first gate intermediate layer;
   providing the second gate intermediate layer with a dielectric layer;
   applying and structuring a second electrode layer to produce a second gate electrode adjacent and laterally overlapping the first gate electrode; and
   providing the first gate electrode and the second gate electrode from materials that are matched to each other in such a way that the first gate electrode and the second gate electrode form a diode structure.

16. The method according to claim 15, which comprises:
   applying an auxiliary layer between the ferroelectric layer and the first electrode layer; and
   structuring the auxiliary layer when performing the step of structuring the ferroelectric layer and the first electrode layer.

* * * * *